(12) United States Patent
French et al.

(10) Patent No.: US 8,524,548 B2
(45) Date of Patent: Sep. 3, 2013

(54) DMOS TRANSISTOR WITH A CAVITY THAT LIES BELOW THE DRIFT REGION

(75) Inventors: William French, San Jose, CA (US); Vladislav Vashchenko, Palo Alto, CA (US); Richard Wendell Foote, Jr., Burleson, TX (US); Alexei Sadovnikov, Sunnyvale, CA (US); Punit Bhola, South Portland, ME (US); Peter J. Hopper, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 63 days.

(21) Appl. No.: 13/094,645

(22) Filed: Apr. 26, 2011

(65) Prior Publication Data

US 2012/0273881 A1    Nov. 1, 2012

(51) Int. Cl.
*H01L 29/66* (2006.01)

(52) U.S. Cl.
USPC .......... 438/163; 257/339; 257/E21.417; 257/E29.261

(58) Field of Classification Search
USPC .......... 257/339, E21.417, E29.261; 438/163
See application file for complete search history.

(56) References Cited

U.S. PATENT DOCUMENTS

| | | | |
|---|---|---|---|
| 5,389,569 A * | 2/1995 | Cambou et al. | 438/422 |
| 6,703,684 B2 | 3/2004 | Udrea et al. | |
| 2001/0023094 A1 * | 9/2001 | D'Arrigo et al. | 438/200 |
| 2005/0029619 A1 | 2/2005 | Forbes | |
| 2007/0246754 A1 | 10/2007 | Sonsky et al. | |
| 2008/0237703 A1 | 10/2008 | Lin et al. | |
| 2011/0057230 A1 | 3/2011 | Udrea et al. | |

OTHER PUBLICATIONS

Merchant, S. et al., "Realization of High Breakdown Voltage (700V) in Thin SOI Devices", Proceedings of the 3rd International Symposium on Power Semiconductor Devices and ICs (ISPSD), pp. 31-35, 1991.
Paul, K. et al., "High Voltage LDMOS Transistors in Sub-Micron SOI Films", Proceedings of the 8th International Symposium on Power Semiconductor Devices and ICs (ISPSD), pp. 89-92, 1996.

* cited by examiner

*Primary Examiner* — Stephen W Smoot
*Assistant Examiner* — Vicki B Booker
(74) *Attorney, Agent, or Firm* — Eugene C. Conser; Wade J. Brady, III; Frederick J. Telecky, Jr.

(57) ABSTRACT

A lateral DMOS transistor formed on a silicon-on-insulator (SOI) structure has a higher breakdown voltage that results from a cavity that is formed in the bulk region of the SOI structure. The cavity exposes a portion of the bottom surface of the insulator layer of the SOI structure that lies directly vertically below the drift region of the DMOS transistor.

6 Claims, 18 Drawing Sheets

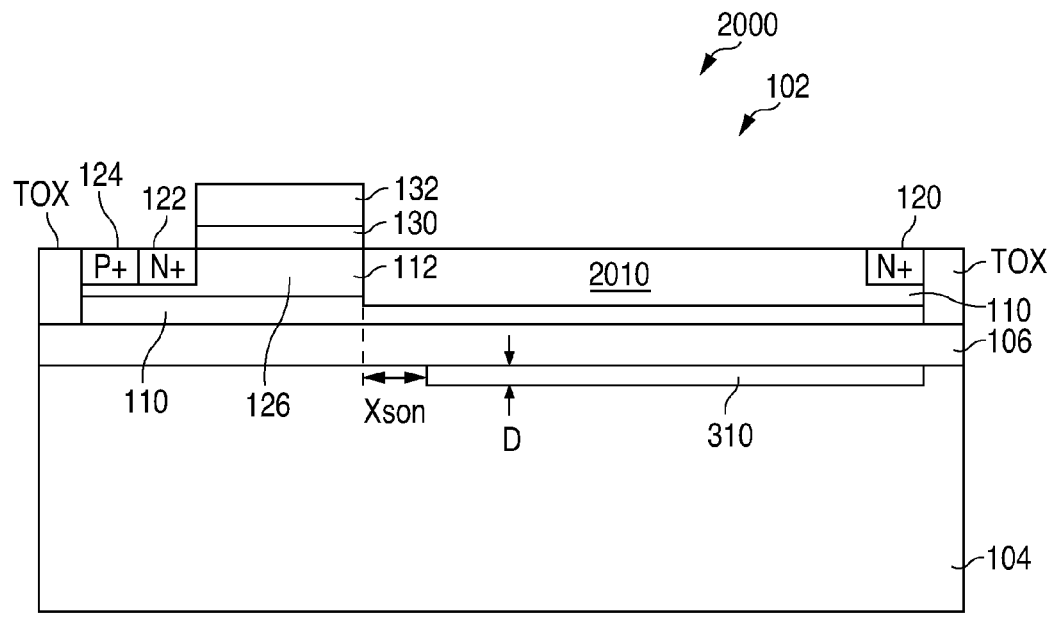
FIG. 20
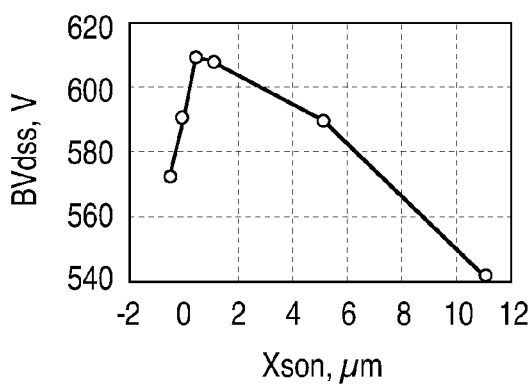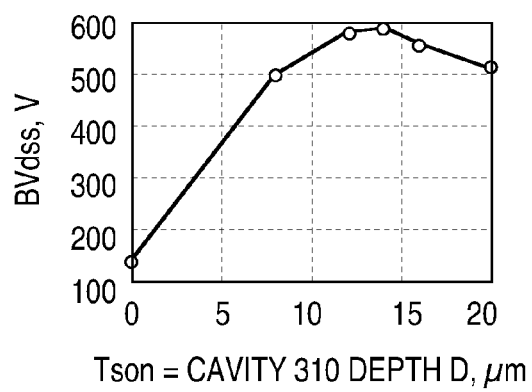
FIG. 21A  FIG. 21B

US 8,524,548 B2

DMOS TRANSISTOR WITH A CAVITY THAT LIES BELOW THE DRIFT REGION

BACKGROUND OF THE INVENTION

1. Field of the Invention

The present invention relates to DMOS transistors and, more particularly, to a DMOS transistor with a cavity that lies below the drift region.

2. Description of the Related Art

A metal-oxide-semiconductor (MOS) transistor is a well-known device that has heavily-doped source and drain semiconductor regions which are separated by a lightly-doped channel semiconductor region of the opposite conductive type. The MOS transistor also has an oxide layer that lies over the channel semiconductor region, and a metal gate that touches the oxide layer and lies over the channel semiconductor region. In addition to metal, the gate of a MOS transistor is also commonly formed with doped polysilicon.

A double-diffused MOS (DMOS) transistor is a power transistor that has a large lightly-doped drain semiconductor region, known as a drift region, which touches the channel semiconductor region and typically lies between the channel semiconductor region and the heavily-doped drain semiconductor region. DMOS transistors are commonly formed as vertical devices where the source and drain regions are vertically spaced apart, and as lateral devices where the source and drain regions are horizontally spaced apart.

In operation, vertical DMOS transistors typically provide better performance (e.g., a lower on-state drain-to-source resistance) than lateral DMOS transistors. Lateral DMOS transistors, however, are usually much easier to fabricate and, therefore, are less expensive to produce than vertical DMOS transistors.

FIG. 1 shows a cross-sectional diagram that illustrates an example of a conventional lateral DMOS transistor 100. As shown in FIG. 1, DMOS transistor 100 includes a silicon-on-insulator (SOI) structure 102 that includes a bulk region 104, an insulator layer 106 approximately 0.4 µm thick that covers the top surface of bulk region 104, and a single-crystal semiconductor region 108 approximately 0.8 µm thick that touches the top surface of insulator layer 106.

In addition, SOI structure 102 includes a trench isolation structure TOX that extends through single-crystal semiconductor region 108 to touch insulator layer 106 and form a number of isolated regions of single-crystal semiconductor region 108. (Only one isolated region of single-crystal semiconductor region 108 is shown for clarity.)

As further shown in FIG. 1, single-crystal semiconductor region 108 includes a p-type well 110 that touches insulator layer 106, a p− body region 112 that touches p-type well (and sets the threshold voltage of DMOS transistor 100), and an n− drift region 114 that touches insulator layer 106, p-type well 110, and p− body region 112.

Single-crystal semiconductor region 108 additionally includes an n+ drain region 120 that touches n− drift region 114 and lies spaced apart from p− body region 112, an n+ source region 122 that touches p− body region 112 and lies spaced apart from n− drift region 114, and a p+ contact region 124 that touches p− body region 112. Thus, n− drift region 114 touches a doped region that includes p-type well 110, p− body region 112, and p+ contact region 124. Also, a channel region 126 of p− body region 112 lies horizontally between and touches n− drift region 114 and n+ source region 122.

As additionally shown in FIG. 1, lateral DMOS transistor 100 further includes a gate oxide layer 130 that touches p− body region 112 over channel region 126, and a gate 132 that touches gate oxide layer 130 over channel region 126. Gate 132 can be implemented with metal or doped polysilicon.

In operation, a first positive voltage is placed on n+ drain region 120 and a second positive voltage is placed on gate 132, while ground is placed on n+ source region 122 and p+ contact region 124. In response to these bias conditions, the channel region 126 of p− body region 112 inverts, and electrons flow from n+ source region 122 to n+ drain region 120.

One important characteristic of a DMOS transistor is the breakdown voltage BVdss of the transistor, which is the maximum off-state voltage which can be placed on n+ drain region 120 before the drift region 114-to-body region 112 junction breaks down, or insulator layer 106 breaks down, whichever is lower. Since DMOS transistors are power transistors, there is a need to handle larger voltages and, thereby, a need to increase the breakdown voltage BVdss of the transistor.

U.S. Pat. No. 6,703,684 to Udrea et al teaches that the breakdown voltage BVdss of a lateral DMOS transistor can be increased by removing the portion of bulk region 104 that lies below the DMOS transistor. FIG. 2 shows a cross-sectional diagram that illustrates an example of a conventional Udrea DMOS transistor 200.

Udrea DMOS transistor 200 is similar to DMOS transistor 100 and, as a result, utilizes the same reference numerals to designate the structures that are common to both DMOS transistors. As shown in FIG. 2, Udrea DMOS transistor 200 differs from DMOS transistor 100 in that Udrea DMOS transistor 200 has a backside opening 210 that extends through bulk region 104 to expose the portion of insulator layer 106 that lies below DMOS transistor 200.

However, although Udrea transistor 200 increases the breakdown voltage BVdss of the transistor, backside trench etching significantly complicates the process flow, requires thick SOI wafers for the etch to stop on, and may require large capital outlays to purchase the equipment required for the process flow.

BRIEF DESCRIPTION OF THE DRAWINGS

FIGS. 5A-19A are plan views. FIGS. 5B-19B are cross-sectional views taken along lines 5B-5B through 19B-19B of FIGS. 5A-19A. FIGS. 5C-19C are cross-sectional views taken along lines 5C-5C through 19C-19C of FIGS. 5A-19A.

FIG. 20 is a cross-sectional diagram illustrating an example of a DMOS transistor 2000 in accordance with an alternate embodiment of the present invention.

FIGS. 21A-21B are graphs further illustrating the operation of DMOS transistor 2000 in accordance with the present invention.

DETAILED DESCRIPTION OF THE INVENTION

Figure 1:
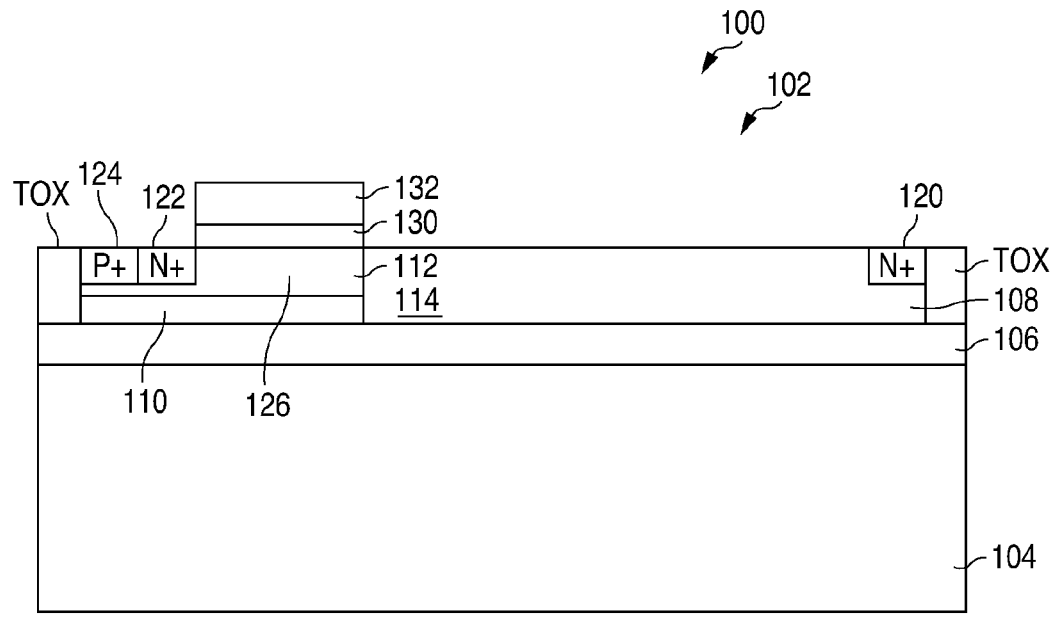
FIG. 1 is a cross-sectional diagram illustrating an example of a conventional lateral DMOS transistor 100.
Figure 2:
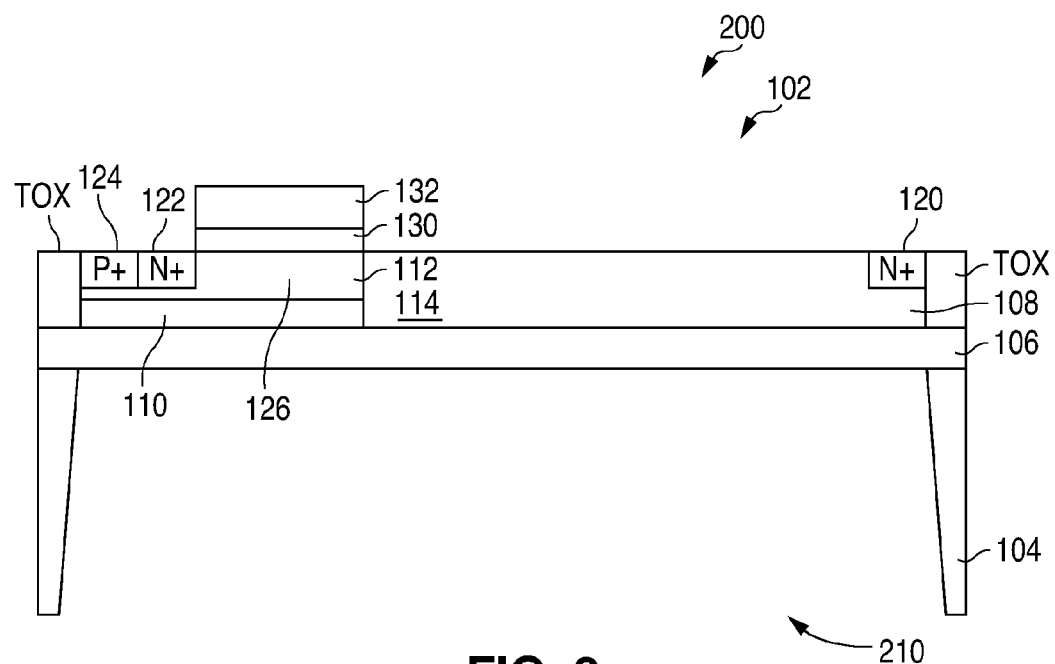
FIG. 2 is a cross-sectional diagram illustrating an example of a conventional Udrea DMOS transistor 200.
Figure 3:
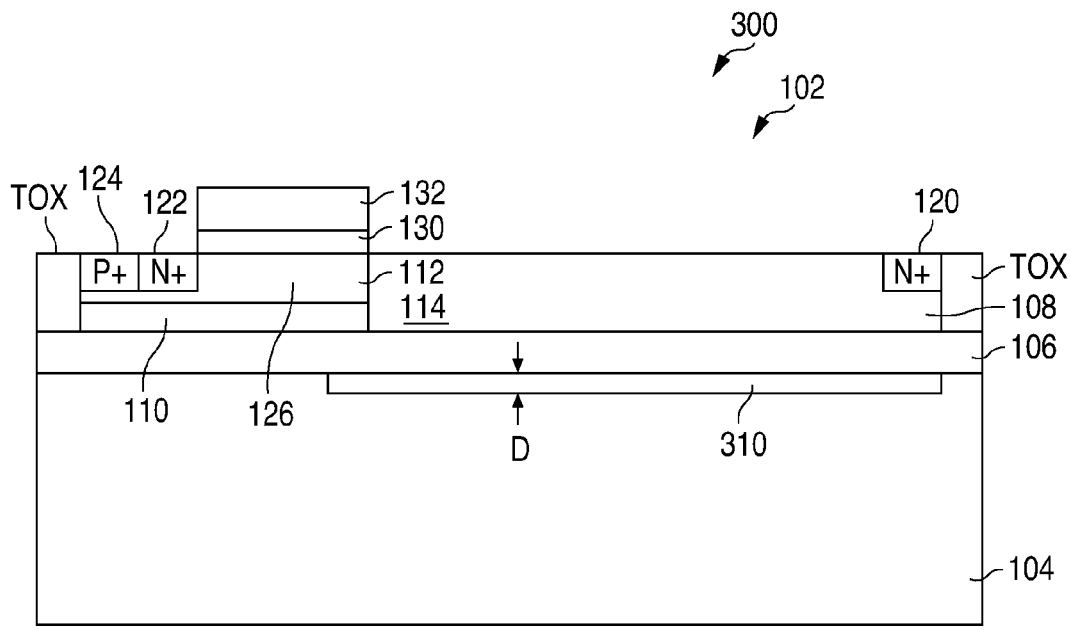
FIG. 3 is a cross-sectional diagram illustrating an example of a DMOS transistor 300 in accordance with the present invention.

FIG. 3 shows a cross-sectional diagram that illustrates an example of a DMOS transistor 300 in accordance with the present invention. As described in greater detail below, the breakdown voltage BVdss of DMOS transistor 300 is increased by forming a cavity in the bulk region of an SOI structure.

DMOS transistor 300 is similar to DMOS transistor 100 and, as a result, utilizes the same reference numerals to designate the structures which are common to both transistors. As shown in FIG. 3, DMOS transistor 300 differs from DMOS transistor 100 in that DMOS transistor 300 has a cavity 310 in bulk region 104 that exposes a portion of the bottom surface of insulator layer 106. The portion of the bottom surface of insulator layer 106, in turn, lies directly vertically below n− drift region 114.

Cavity 310 is a single region that has a depth D and, in the FIG. 3 example, a portion that lies directly vertically beneath a portion of gate 132. Alternately, no portion of cavity 310 can lie directly vertically below any portion of gate 132. As described, DMOS transistor 300 includes a lateral pn diode (p− body region 112 and n− drift region 114) and a vertically isolated field plate.

DMOS transistor 300 operates the same as DMOS transistor 100, except that when a voltage is applied to n+ drain region 120, the vertical component of the electric field across insulator layer 106 induces a space charge depletion region across n− drift region 114 and insulator layer 106 as a result of the RESURF (REducedSURfaceField) principle which, in turn, lowers the lateral electric field. The lowered lateral electric field increases the breakdown voltage BVdss of DMOS transistor 300 which, in turn, allows DMOS transistor 300 to operate with higher drain voltage levels.

Figure 4:
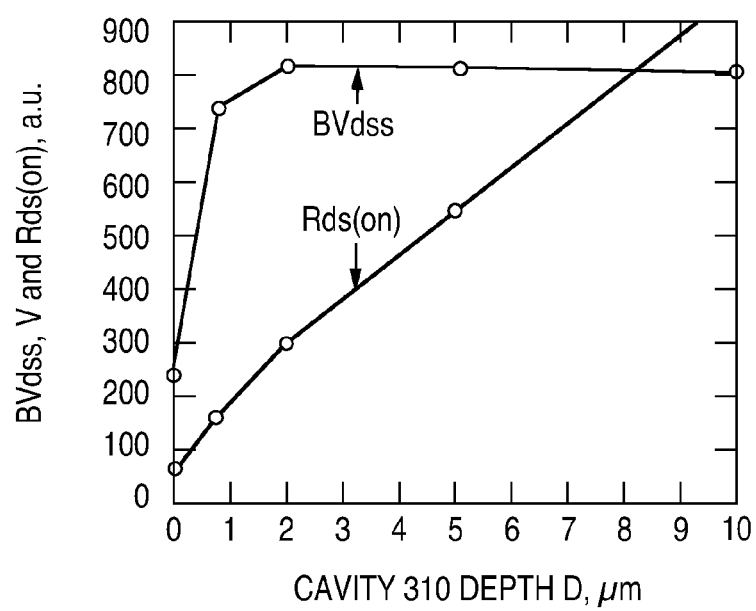
FIG. 4 is a graph further illustrating the operation of DMOS transistor 300 in accordance with the present invention.

FIG. 4 shows a graph that further illustrates the operation of DMOS transistor 300 in accordance with the present invention. The graph compares a simulated breakdown voltage BVdss versus the depth D of cavity 310 of DMOS transistor 300. As shown in FIG. 4, with the correct depth D of cavity 310, a breakdown voltage BVdss in excess of 700V can be realized.

In addition, FIG. 4 also illustrates the relationship between the on-state drain-to-source resistance $r_{DS(ON)}$ of DMOS transistor 300 and the depth D of cavity 310. As further shown in FIG. 4, the on-state drain-to-source resistance $r_{DS(ON)}$ rises generally linearly as the depth D of cavity 310 increases. DMOS transistors are power transistors and, as a result, can pass large currents when turned on. As a result, a low on-state drain-to-source resistance $r_{DS(ON)}$ of the transistor is an important factor.

Further, silicon, oxide, and air (in cavity 310) have very different dielectric constants (e.g., 11.9, 3.9, and 1.0, respectively). The lower the value, the more electric field lines are drawn to that region. However, as the depth D of cavity 310 increases, fewer electric field lines can be drawn to the region. The lower the dielectric constant, the better it is for this effect.

When the depth D of cavity 310 is very large, the potential lines freely spread into cavity 310, and the thickness of insulator layer 106 no longer limits the breakdown voltage BVdss. As a result, the doping of n− drift region 114 should be greatly reduced when the depth D of cavity 310 is very large.

In the FIG. 4 example, a DMOS transistor with a breakdown voltage BVdss in excess of 700V and a low on-state drain-to-source resistance $r_{DS(ON)}$ can be realized (with insulator layer 106 approximately 0.4 μm thick and semiconductor region 108 approximately 0.8 μm thick) when cavity 310 has a depth D of approximately 1.5 μm.

FIGS. 5A-5C through 19A-19C show views that illustrate a method of forming a DMOS transistor in accordance with the present invention. FIGS. 5A-19A are plan views, while FIGS. 5B-19B are cross-sectional views taken along lines 5B-5B through 19B-19B of FIGS. 5A-19A, and FIGS. 5C-19C are cross-sectional views taken along lines 5C-5C through 19C-19C of FIGS. 5A-19A.

Figure 5A:
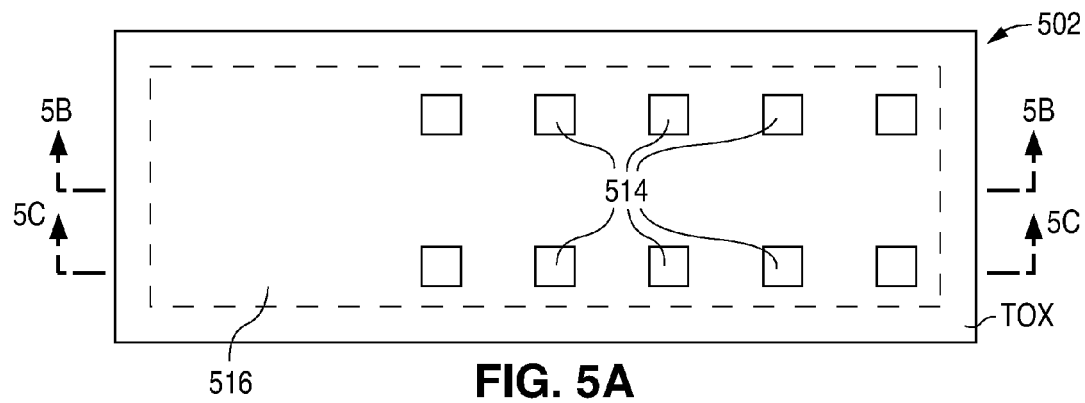
FIGS. 5A-5C through 19A-19C are views illustrating a method of forming a DMOS transistor in accordance with the present invention.
Figure 5B:
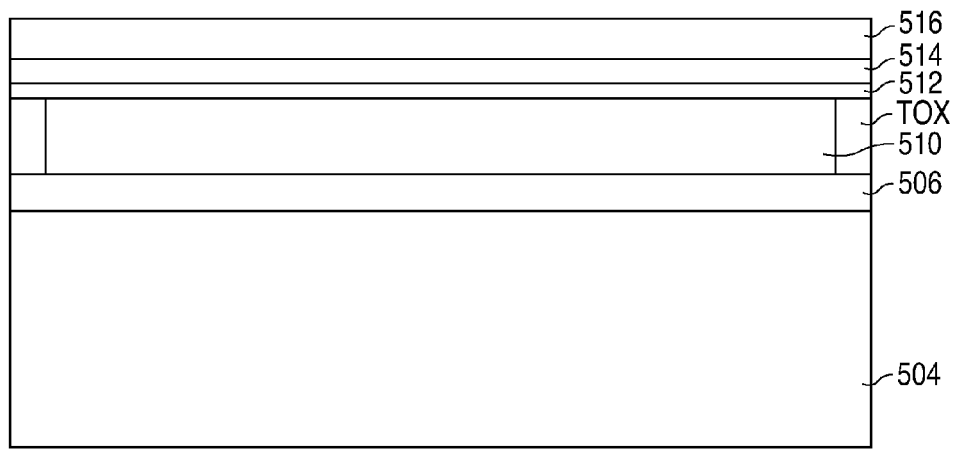
Figure 5C:
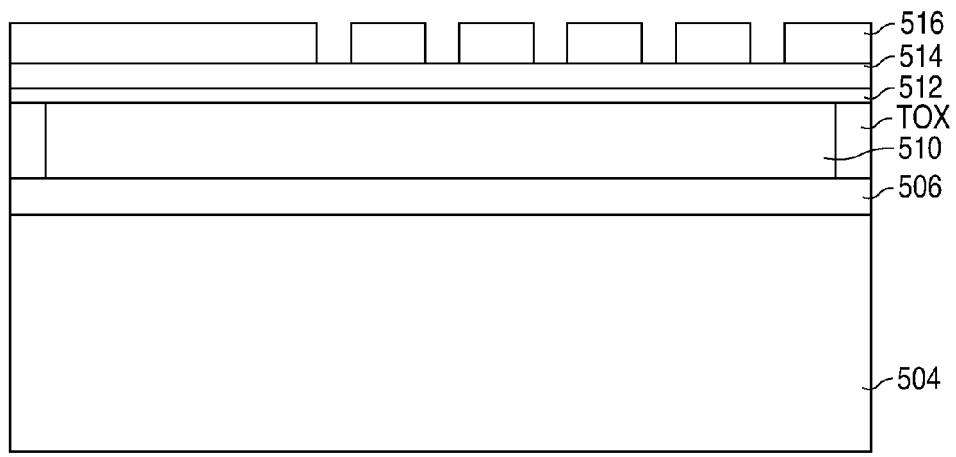

As shown in FIGS. 5A-5C, the method utilizes a conventionally-formed SOI wafer 502 that includes a bulk region 504 approximately 750 μm thick, an insulator layer 506 approximately 0.4 μm thick that covers the top surface of bulk region 504, and a single-crystal semiconductor region 510 approximately 0.45 μm thick that touches the top surface of insulator layer 506.

In addition, SOI wafer 502 includes a trench isolation structure TOX that extends through single-crystal semiconductor region 510 to touch insulator layer 506 and form a number of isolated regions of single-crystal semiconductor region 510. (Only one isolated region of single-crystal semiconductor region 510 is shown for clarity.)

As further shown in FIGS. 5A-5C, the method begins by depositing a layer of pad oxide 512 onto single-crystal semiconductor region 510, such as by low-pressure chemical vapor deposition (LPCVD), followed by the deposition of a layer of silicon nitride 514 onto pad oxide layer 512 by, for example, LPCVD.

After this, a patterned photoresist layer 516 is formed on the top surface of silicon nitride layer 514. Patterned photoresist layer 516 is formed in a conventional manner, which includes depositing a layer of photoresist, and projecting a light through a patterned black/clear glass plate known as a mask to form a patterned image on the layer of photoresist. The light softens the photoresist regions exposed to the light. Following this, the softened photoresist regions are removed.

Figure 6A:
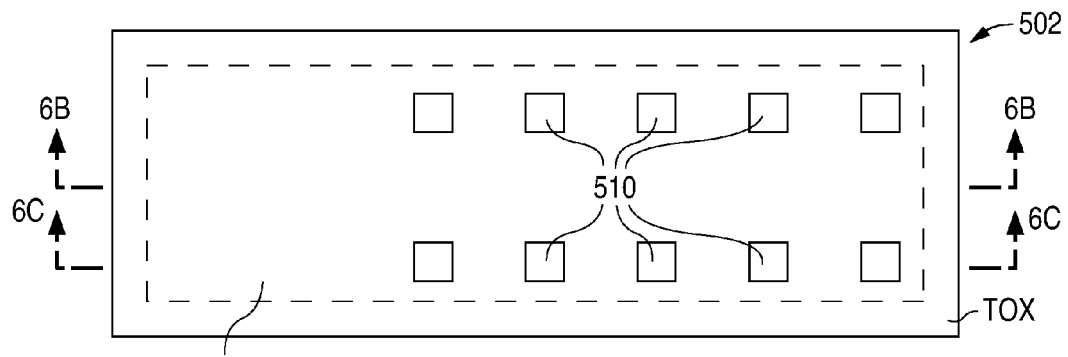
Figure 6B:
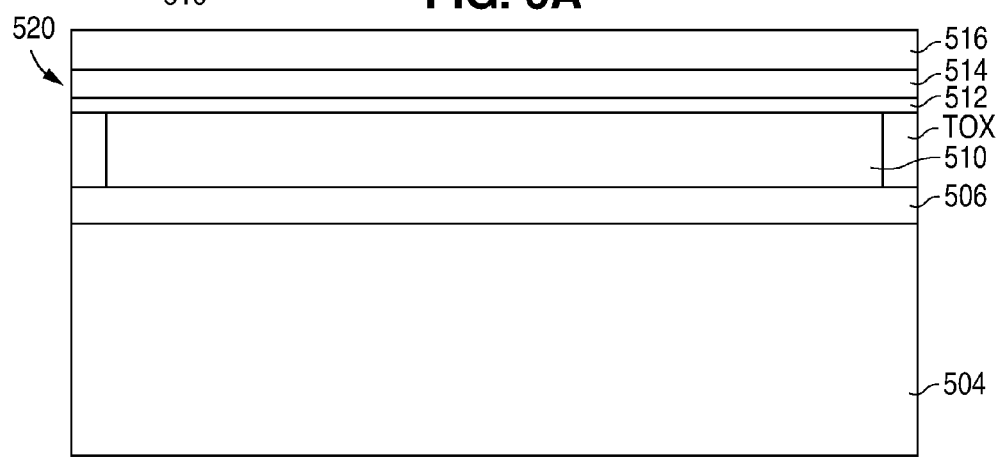
Figure 6C:
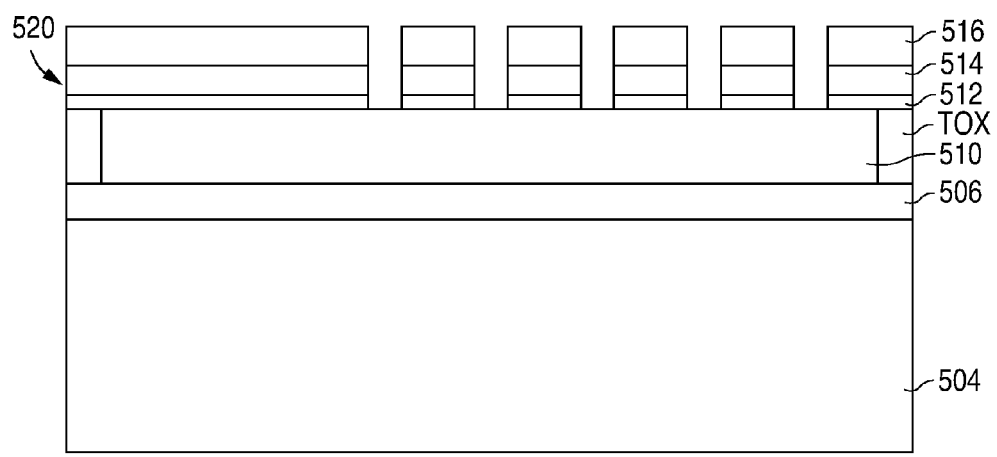

As shown in FIGS. 6A-6C, after patterned photoresist layer 516 has been formed, the exposed regions of silicon nitride layer 514 and pad oxide layer 512 are anisotropically etched in a conventional manner to expose regions on the surface of single-crystal semiconductor region 510, and thereby form a patterned hard mask 520. Thus, patterned hard mask 520 has a pattern that is defined by the etch of silicon nitride layer 514 and pad oxide layer 512. After the etch, patterned photoresist layer 516 is removed in a conventional manner.

Figure 7A:
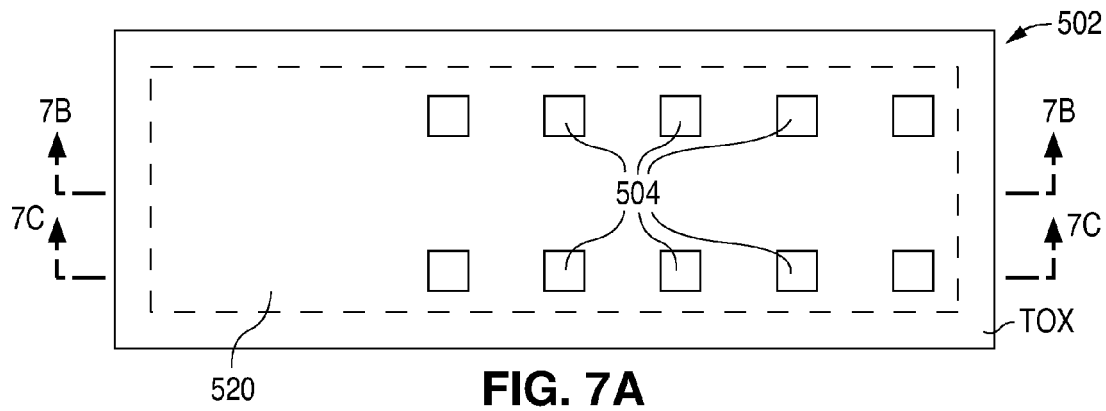
Figure 7B:
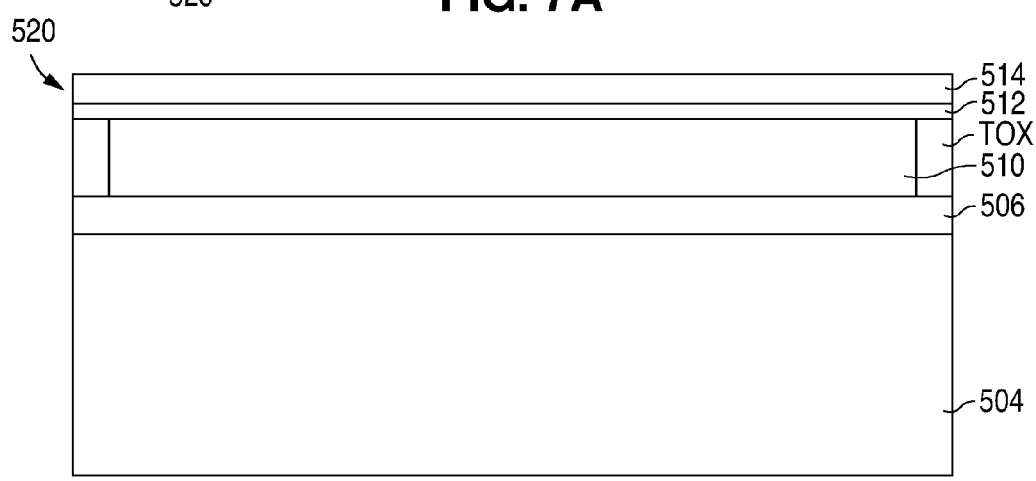
Figure 7C:
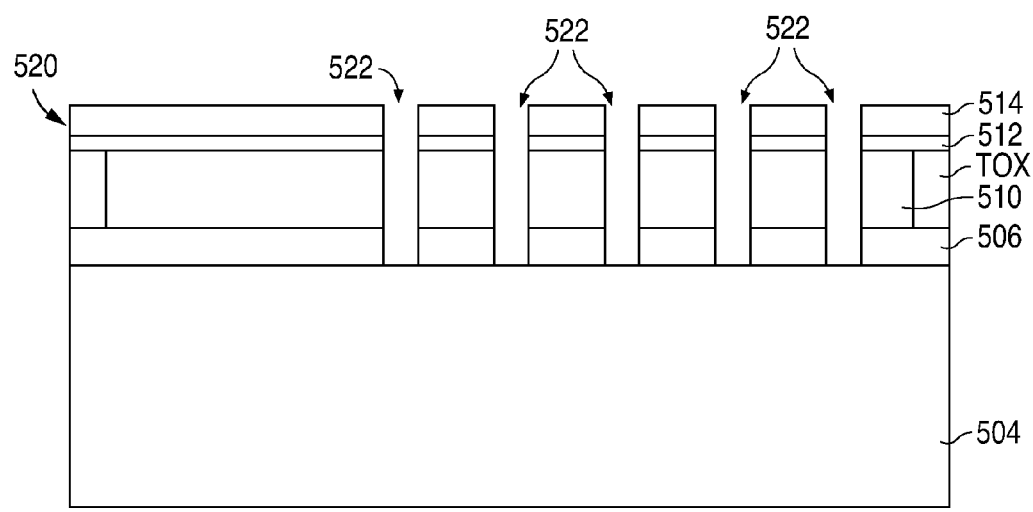

As shown in FIGS. 7A-7C, after hard mask 520 has been formed, the exposed regions of single-crystal semiconductor region 510 and insulator layer 506 are anisotropically dry etched to form a number of openings 522 that each expose the top surface of bulk region 504. The openings 522 can extend through regions of single-crystal semiconductor region 510 that will subsequently be implanted to form a lightly-doped drift region, and thereby act as lateral RESURF regions, or a heavily-doped region. The openings 522 can alternately be formed through trench isolation structure TOX.

Figure 8A:
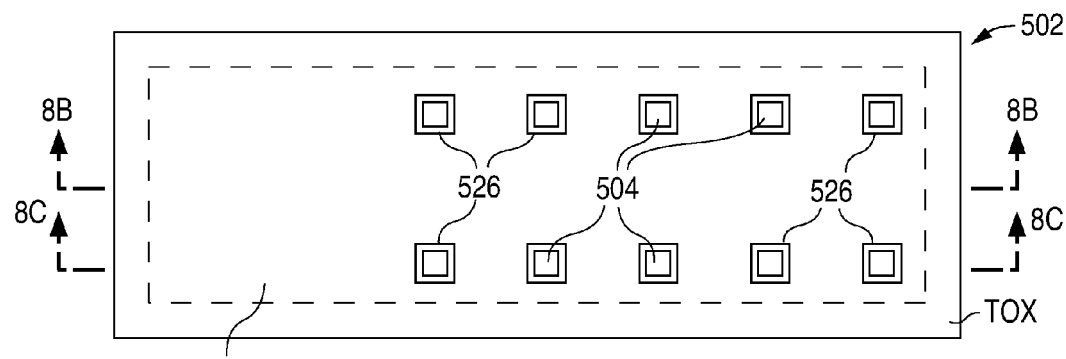
Figure 8B:
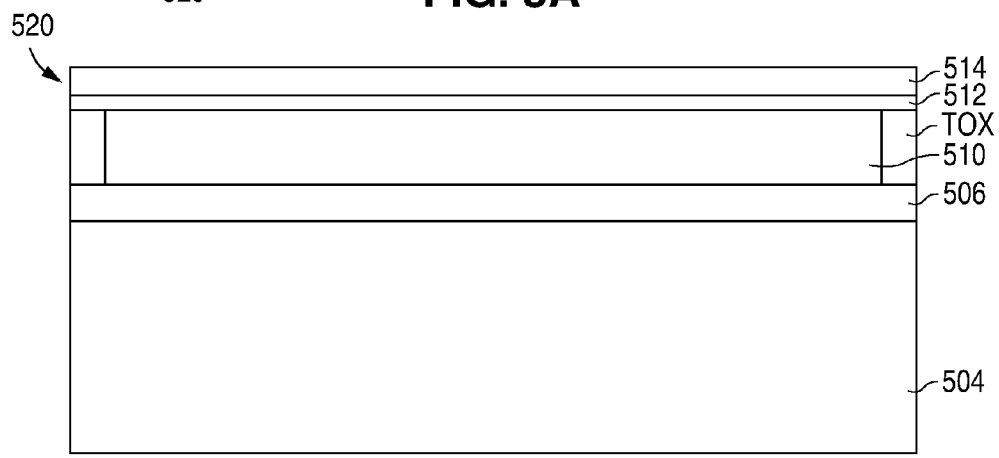
Figure 8C:
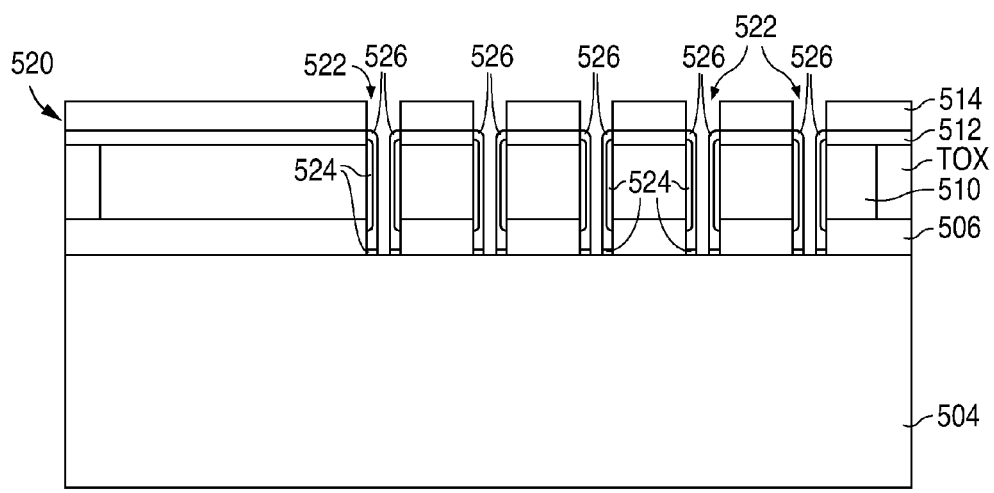

Next, as shown in FIGS. 8A-8C, SOI wafer 502 is oxidized to form an oxide layer 524 on the silicon surfaces exposed by the etch. Following this, a layer of silicon nitride is conventionally deposited. The silicon nitride layer and oxide layer 524 are then anisotropically etched back in a conventional manner to expose the top surface of bulk region 504, and form side wall spacers 526 that line the side walls of the openings 522.

Figure 9A:
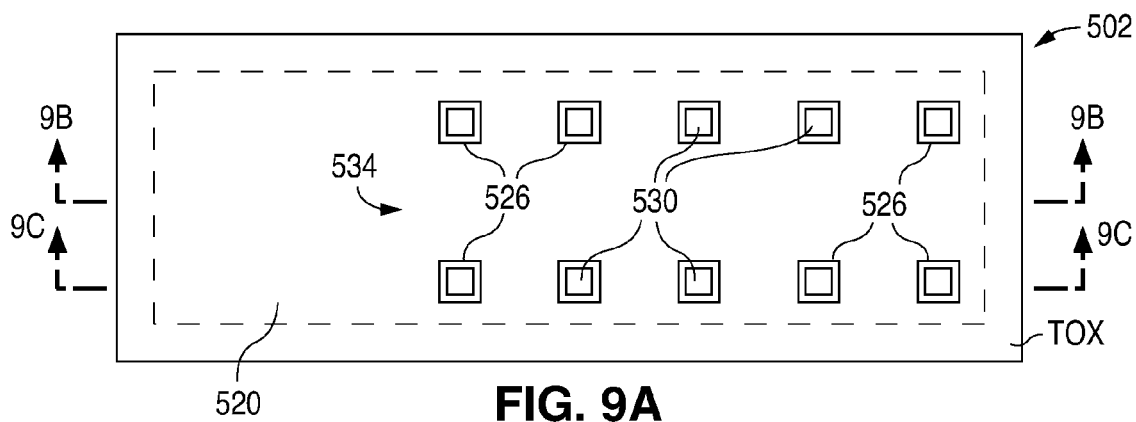
Figure 9B:
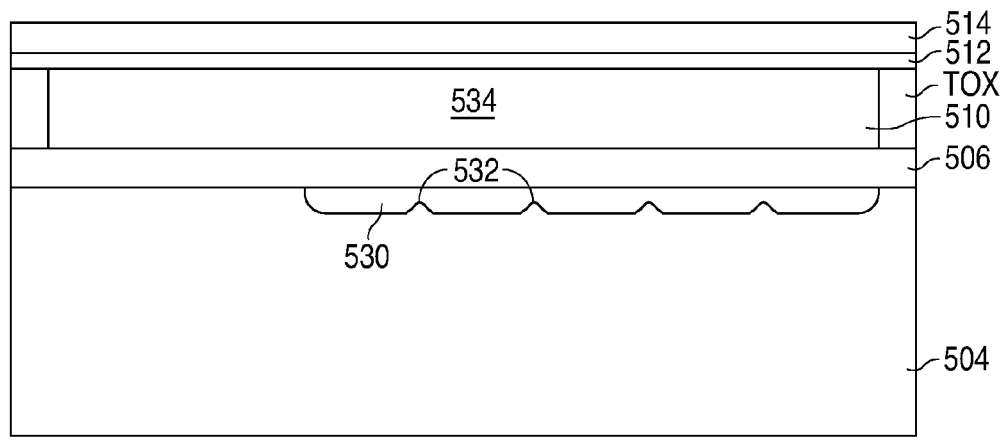
Figure 9C:
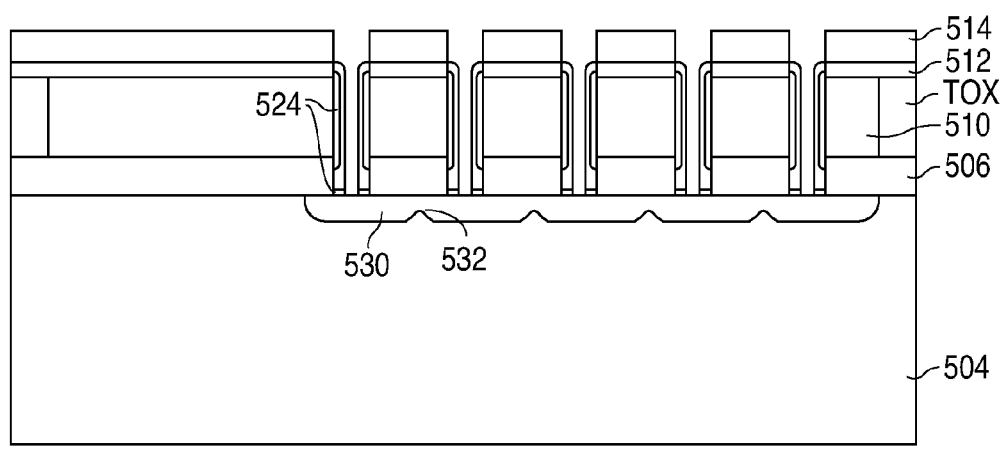

As shown in FIGS. 9A-9C, after the side wall spacers 526 have been formed, SOI wafer 502 is wet etched in a conventional manner with an etchant that is selective to silicon to form a cavity 530 in bulk region 504. In addition, the bottom surface of cavity 530 between adjacent openings 522 has peaks 532 that result from using a wet isotropic etch. The density of the openings 522 should be placed so as to minimize the height of the peaks 532.

As additionally shown in FIG. 9B, cavity 530 extends under a transistor portion 534 of single-crystal semiconductor region 510 and the underlying portion of insulator layer 506. Once cavity 530 has been formed, silicon nitride layer 514 and the nitride portion of the side wall spacers 526 are removed with a conventional process.

Figure 10A:
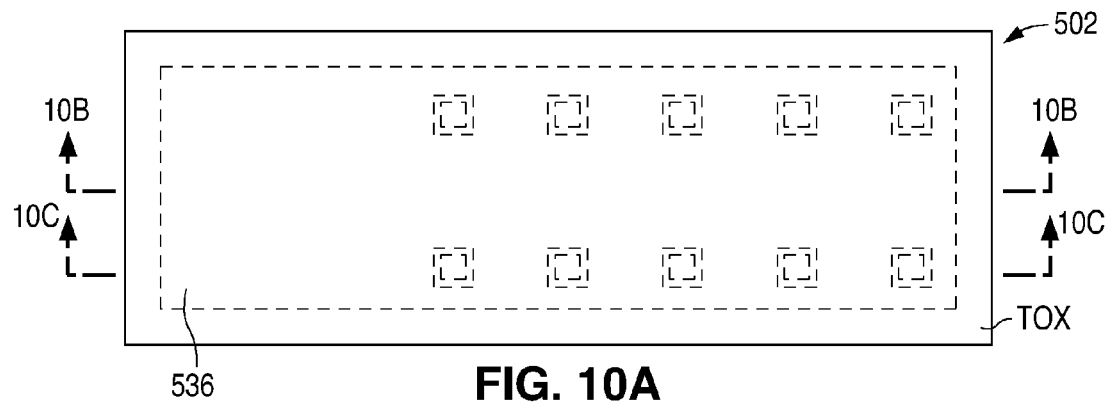
Figure 10B:
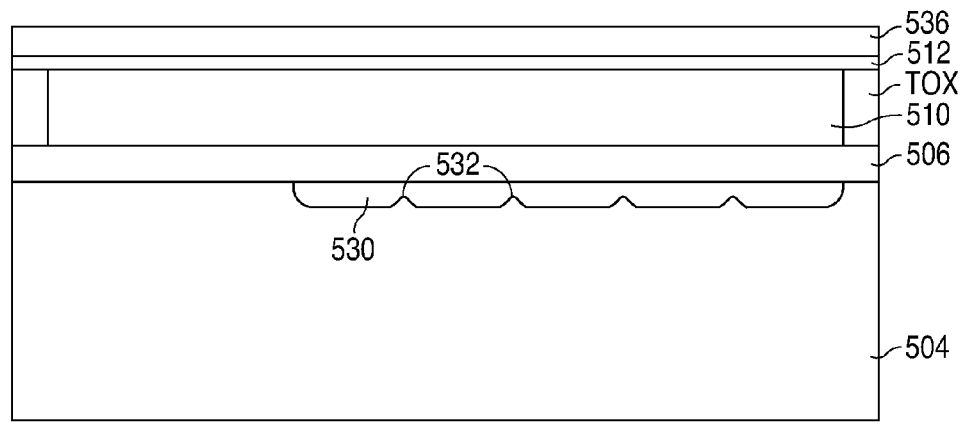
Figure 10C:
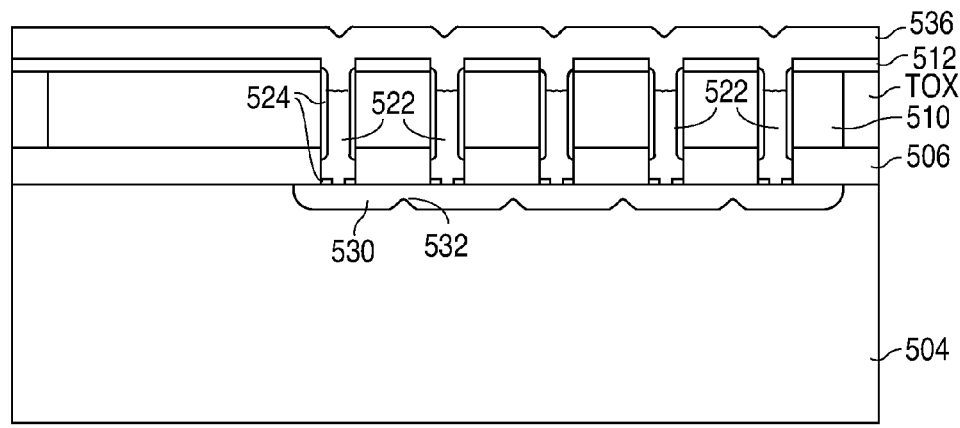

Following the removal of silicon nitride layer 514 and the nitride portion of the side wall spacers 526, as shown in FIGS. 10A-10C, a layer of capping oxide 536 is deposited on pad oxide layer 512 by, for example, chemical vapor deposition. As further shown in FIGS. 10A-10C, capping oxide layer 536 covers, but does not fill, the openings 522.

Figure 11A:
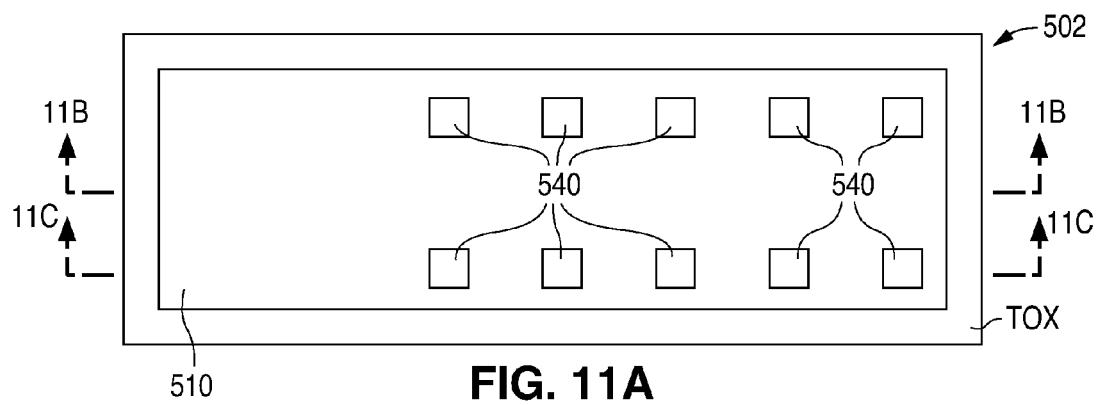
Figure 11B:
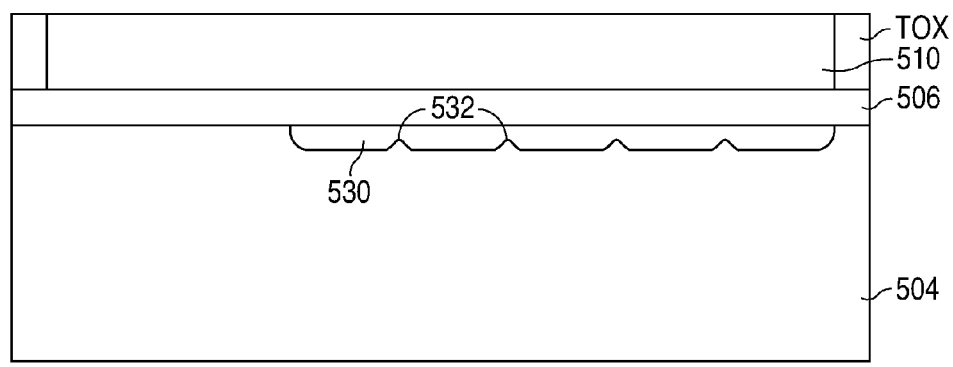
Figure 11C:
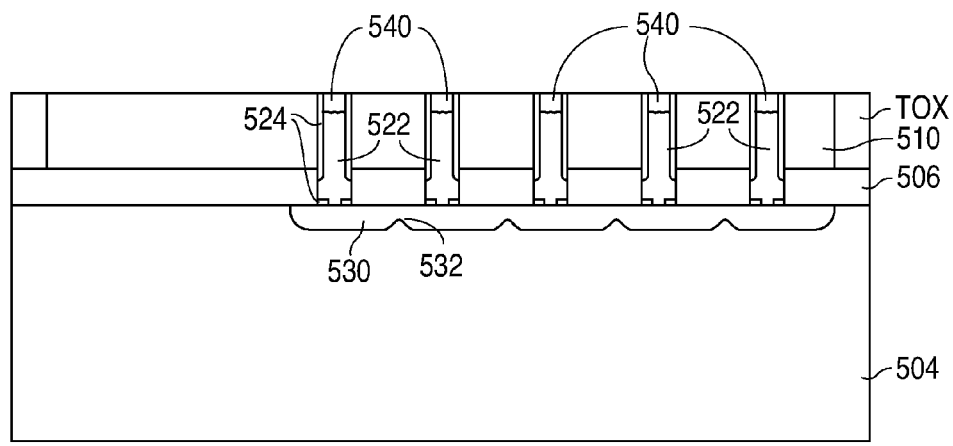

Next, as shown in FIGS. 11A-11C, SOI wafer 502 is planarized in a conventional manner to remove pad oxide layer 512 and the portions of capping oxide layer 536 that lie above the top surface of single-crystal semiconductor region 510 to expose the top surface of single-crystal semiconductor region 510.

For example, a planarizing material can first be deposited on capping oxide layer 536 to form a flat surface. After this, SOI wafer 502 can be wet etched with an etchant that etches the planarizing material and the oxide (capping oxide layer 536 and pad oxide layer 512) at substantially the same rate. The etch continues until the top surface of single-crystal semiconductor region 510 has been exposed.

Chemical-mechanical polishing can alternately be used to remove an upper portion of the oxide, but is unlikely to be used to expose the top surface of single-crystal semiconductor region 510 unless chemical-mechanical polishing can be performed without damaging the top surface of single-crystal semiconductor region 510.

Figure 12A:
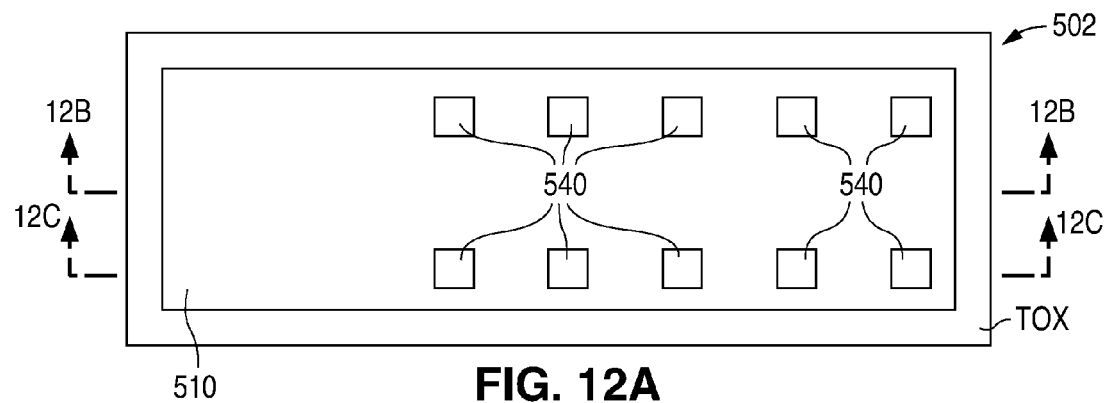
Figure 12B:
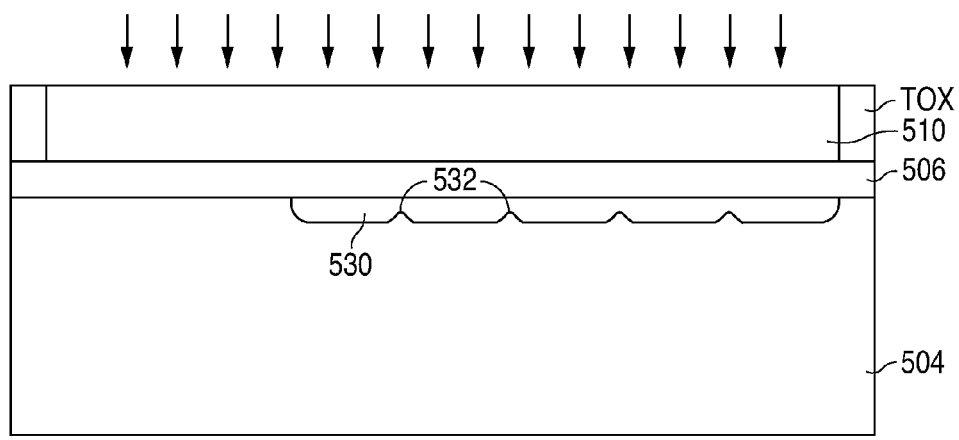
Figure 12C:
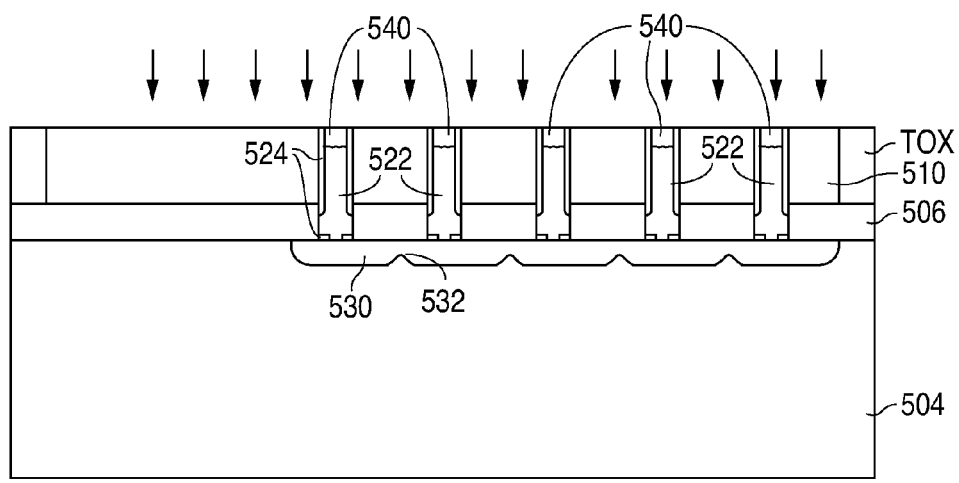

In addition, as further shown in FIGS. 11A-11C, the planarization forms oxide plugs 540. Following the planarization and the exposure of the top surface of single-crystal semiconductor region 510, as shown in FIGS. 12A-12C, a p-type dopant, such as boron, is blanket implanted into the top surface of single-crystal semiconductor region 510 to set the dopant concentration of a to-be-formed p-type well region. The blanket implant can alternately be performed before SOI wafer 502 is planarized.

Figure 13A:
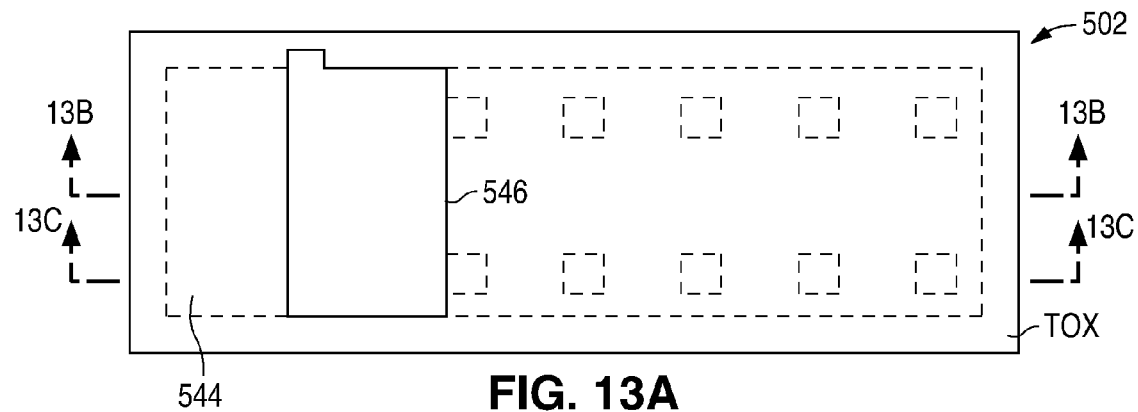
Figure 13B:
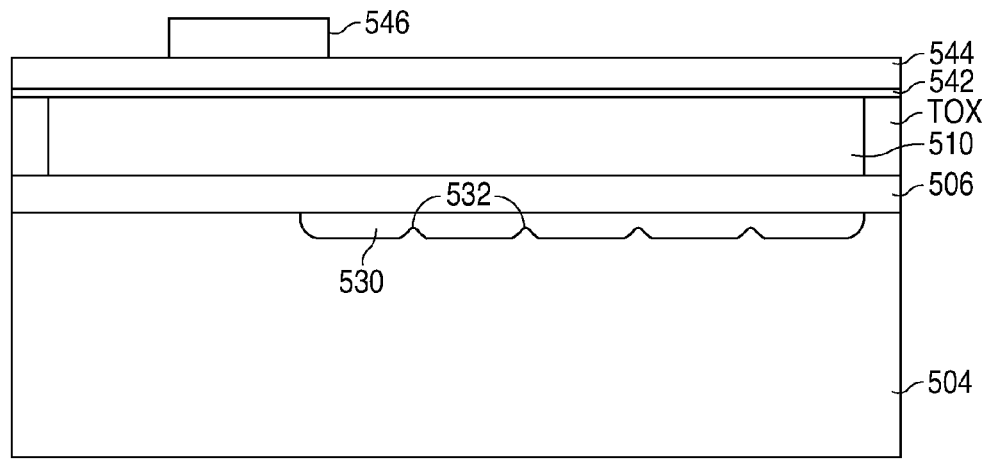
Figure 13C:
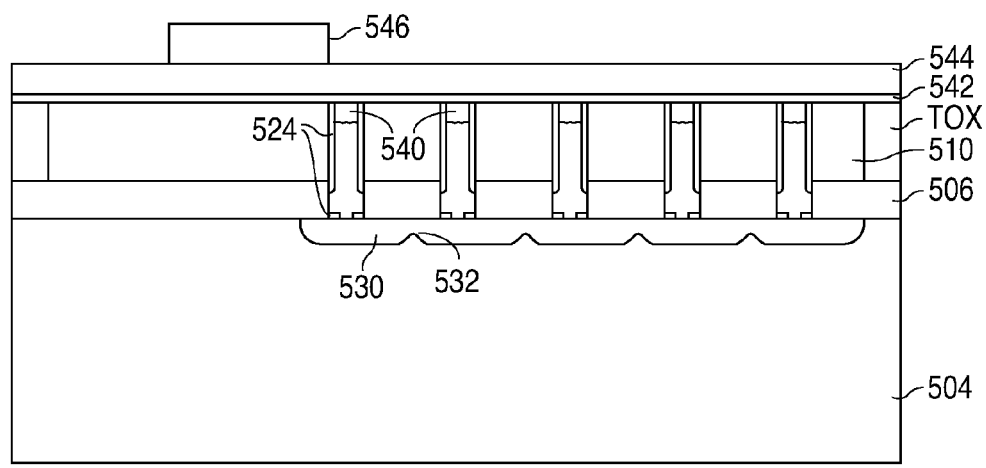

Next, as shown in FIGS. 13A-13C, a non-conductive layer 542, such as a gate oxide, is formed on the top surface of single-crystal semiconductor region 510. Following the formation of non-conductive layer 542, a polysilicon layer 544 is formed to touch gate oxide layer 542.

Once polysilicon layer 544 has been formed, polysilicon layer 544 is doped using, for example, an n-type blanket implant with a dose of $1.79 \times 10^{16}$ atoms/cm$^3$ and an implant energy of 30 KeV. After this, a patterned photoresist layer 546 is formed on polysilicon layer 544 in a conventional manner.

Figure 14A:
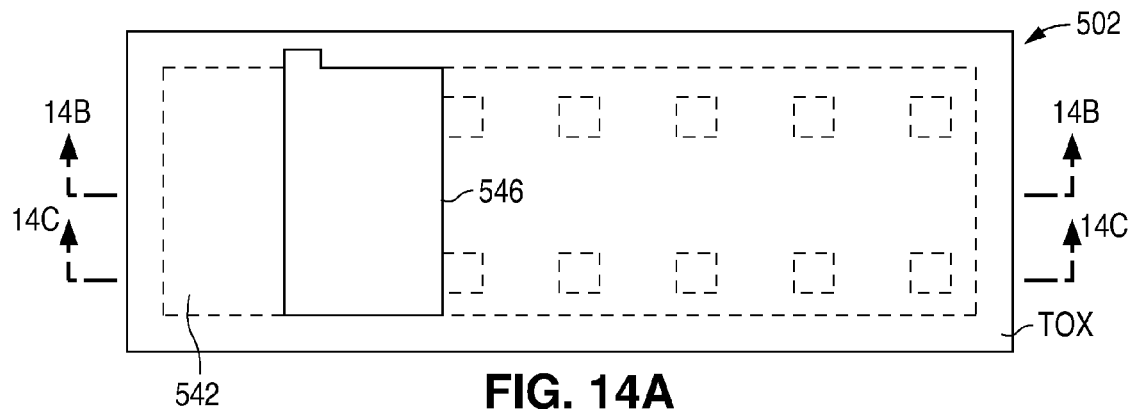
Figure 14B:
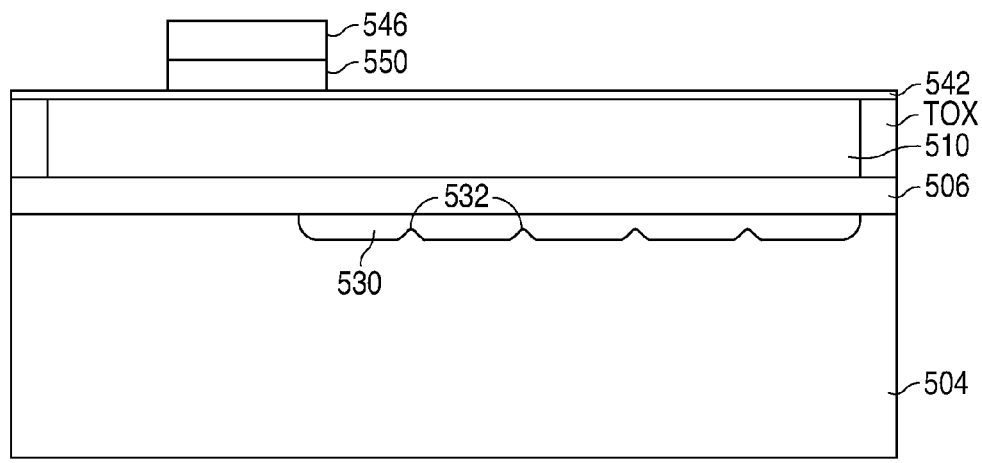
Figure 14C:
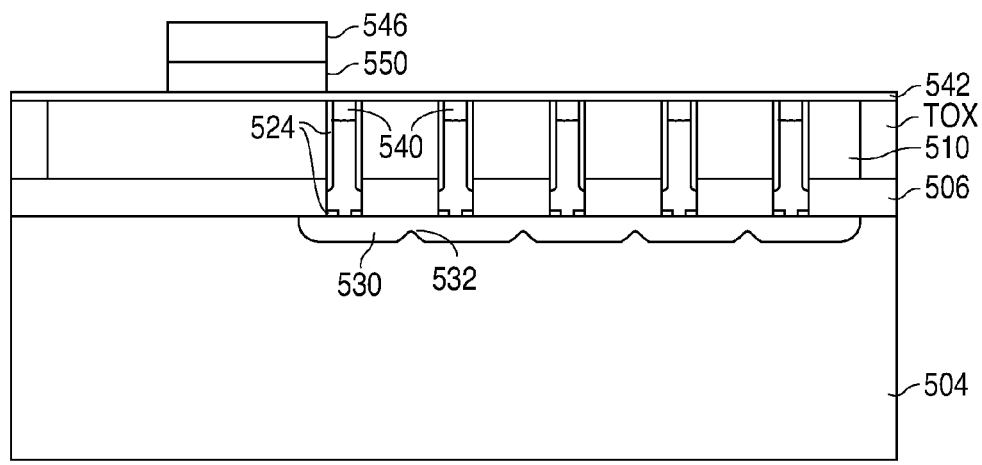
Figure 15A:
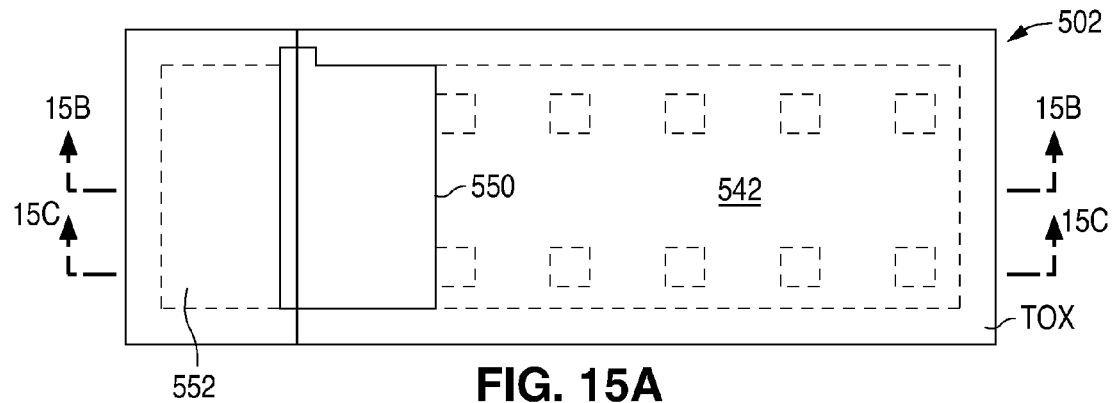
Figure 15B:
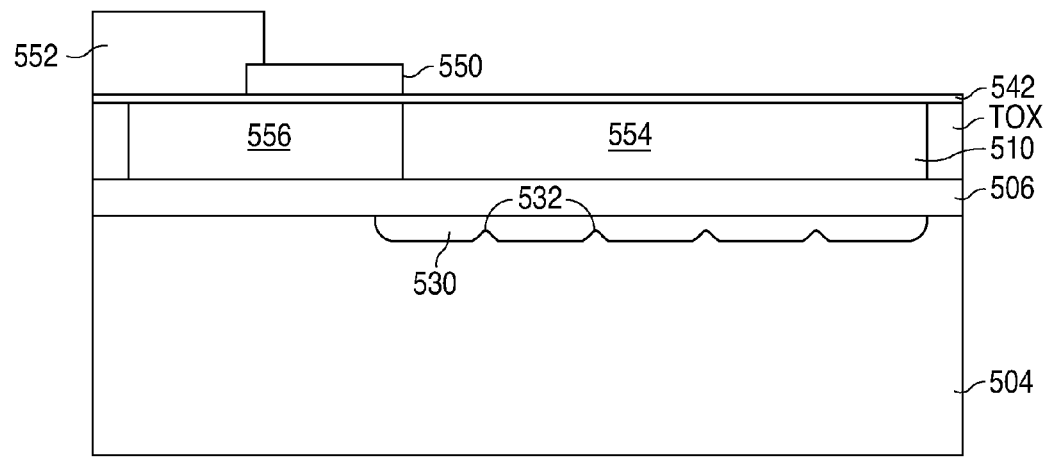
Figure 15C:
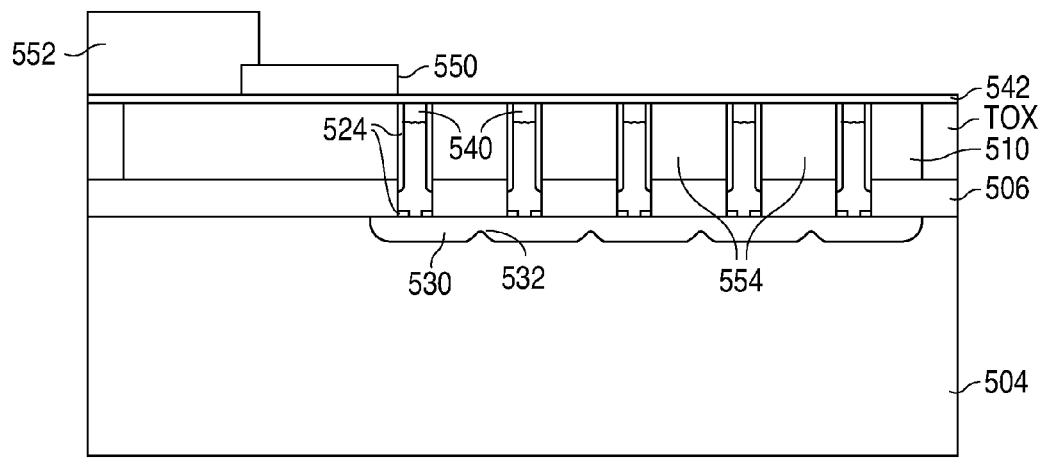

Next, as shown in FIGS. 14A-14C, the exposed regions of polysilicon layer 544 are etched away in a conventional manner to form a gate 550. Patterned photoresist layer 546 is then removed using conventional steps. After this, as shown in FIGS. 15A-15C, a patterned photoresist layer 552 is formed over single-crystal semiconductor region 510 in a conventional manner.

Next, an n-type dopant, such as phosphorous, is implanted into the top surface of single-crystal semiconductor region 510 to form an n− drift region 554 and, thereby, also form a p-type well region 556. For example, n− drift region 554 can have a dopant concentration of approximately $1 \times 10^{16}$ atoms/cm$^3$, and a length of approximately 30-50 μm. Doping decreases as the depth D of cavity 530 increases.

N− drift region 554 can alternately be formed to have a graded dopant concentration by using multiple patterned photoresist layers. For example, the region of n− drift region 554 closest to gate 550 can have a dopant concentration of approximately $8 \times 10^{15}$ atoms/cm$^3$ that increases linearly to approximately $3 \times 10^{16}$ atoms/cm$^3$ in the region that lies furthest from gate 550. Patterned photoresist layer 552 is then removed in a conventional manner.

Figure 16A:
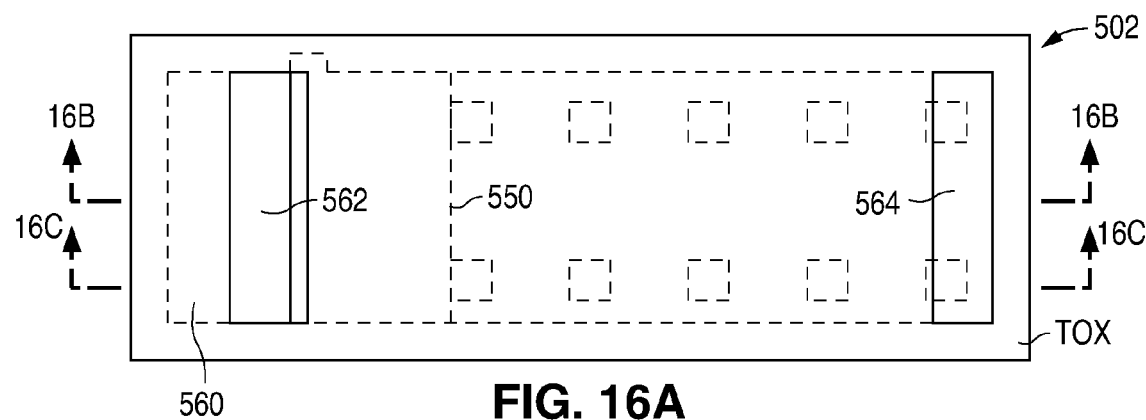
Figure 16B:
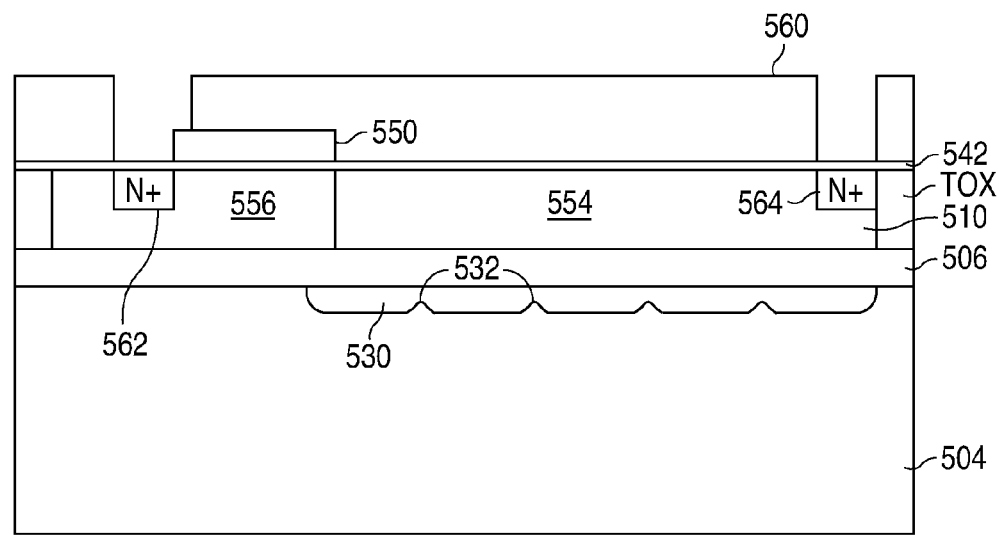
Figure 16C:
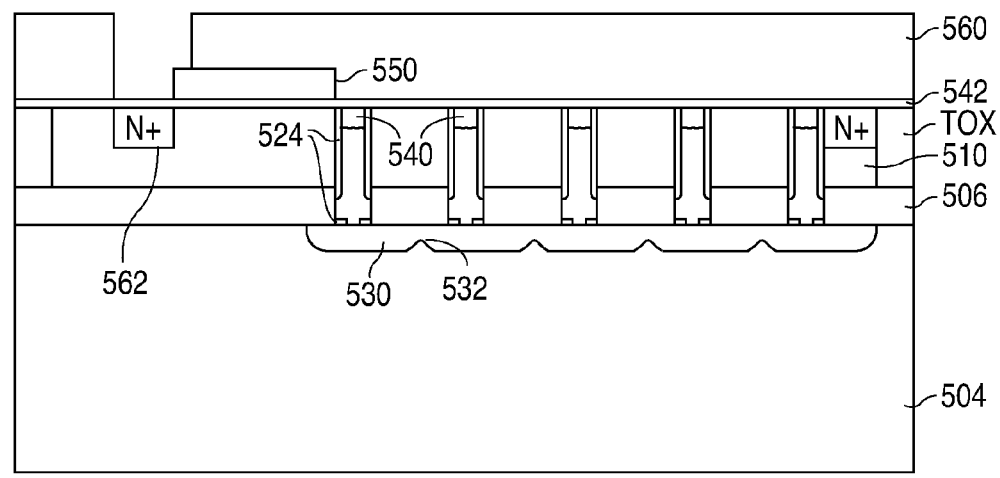

Following the removal of patterned photoresist layer 552, as shown in FIGS. 16A-16C, a patterned photoresist layer 560 is formed over single-crystal semiconductor region 510 in a conventional manner. Next, an n-type dopant, such as arsenic, is implanted into the top surface of single-crystal semiconductor region 510 to form an n+ source region 562 and an n+ drain region 564. For example, the n+ source and drain regions 562 and 564 can have a dopant concentration of $1 \times 10^{18}$ atoms/cm$^3$. Patterned photoresist layer 560 is then removed in a conventional manner.

Figure 17A:
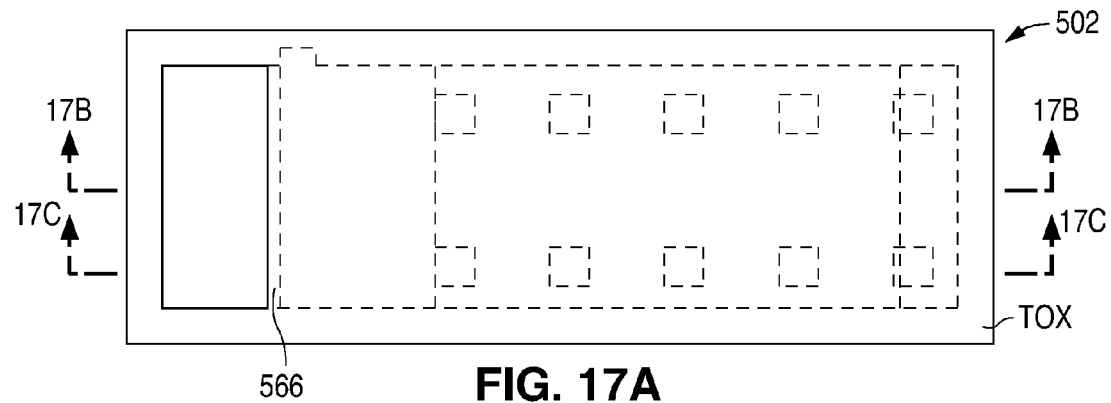
Figure 17B:
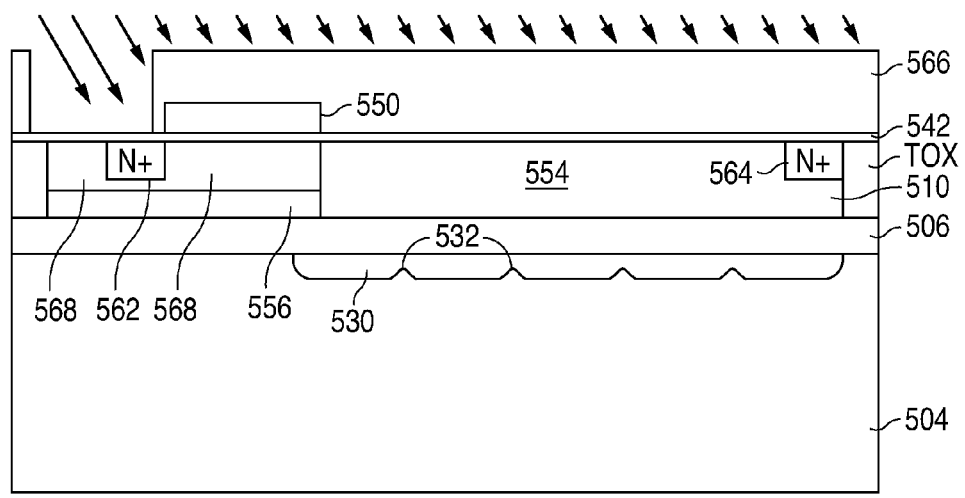
Figure 17C:
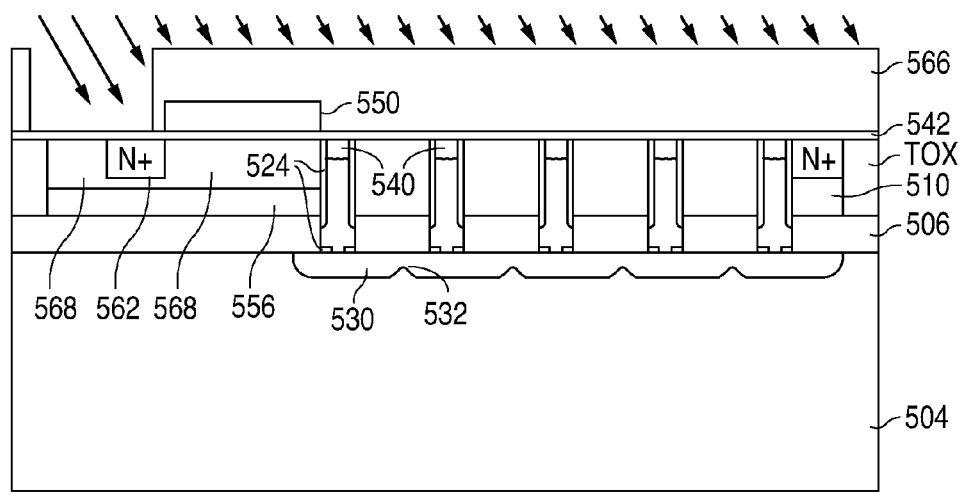

Following the removal of patterned photoresist layer 560, as shown in FIGS. 17A-17C, a patterned photoresist layer 566 is formed over single-crystal semiconductor region 510 in a conventional manner. Next, a p-type dopant, such as boron, is implanted into the top surface of single-crystal semiconductor region 510 at an angle to form a p− body region 568. The implant sets the threshold voltage of the to-be-formed DMOS transistor. Patterned photoresist layer 566 is then removed in a conventional manner.

Figure 18A:
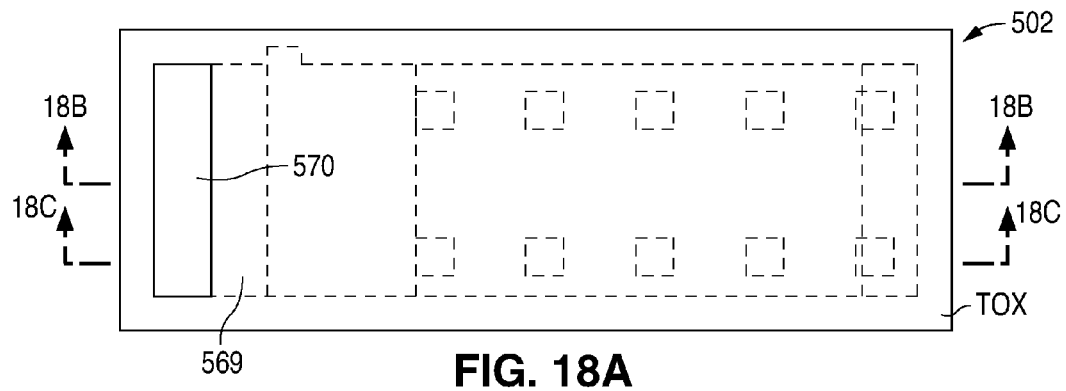
Figure 18B:
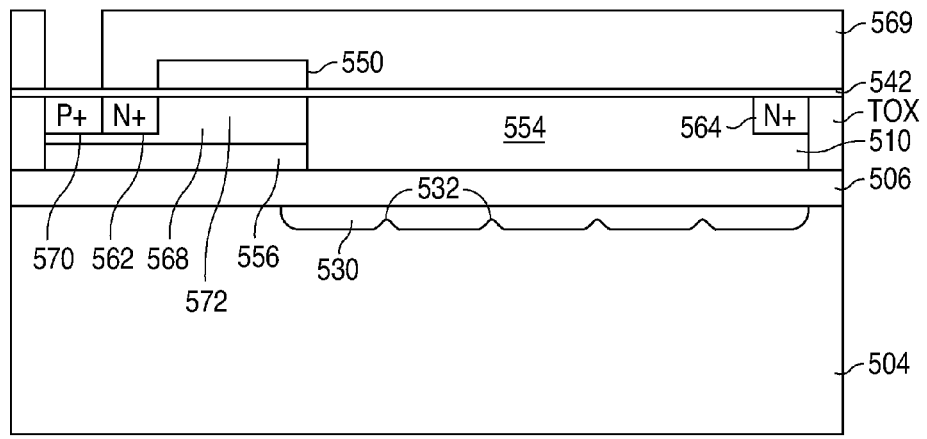
Figure 18C:
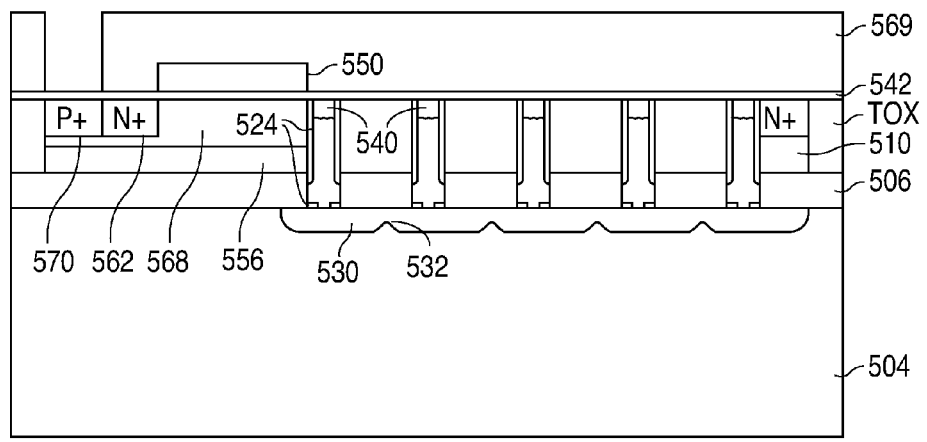

Following the removal of patterned photoresist layer 566, as shown in FIGS. 18A-18C, a patterned photoresist layer 569 is formed over single-crystal semiconductor region 510 in a conventional manner. Next, a p-type dopant, such as boron, is implanted into the top surface of single-crystal semiconductor region 510 to form a p+ contact region 570 that touches p− body region 568. For example, p+ contact region 570 can have a dopant concentration of $1 \times 10^{18}$ atoms/cm$^3$.

Thus, n− drift region 554 touches a doped region that includes p-type well region 556, p− body region 568, and p+ contact region 570. Also, a channel region 572 of p− body region 568 lies horizontally between and touches n− drift region 554 and n+ source region 562. (Additional vertical p-type implants can be made, such as to form a deep p-type region in p− body region 568 that lies below n+ source region 562 and p+ contact region 570, in the same manner described above, i.e., form mask, implant, remove mask, to further tailor the p-type region.)

Figure 19A:
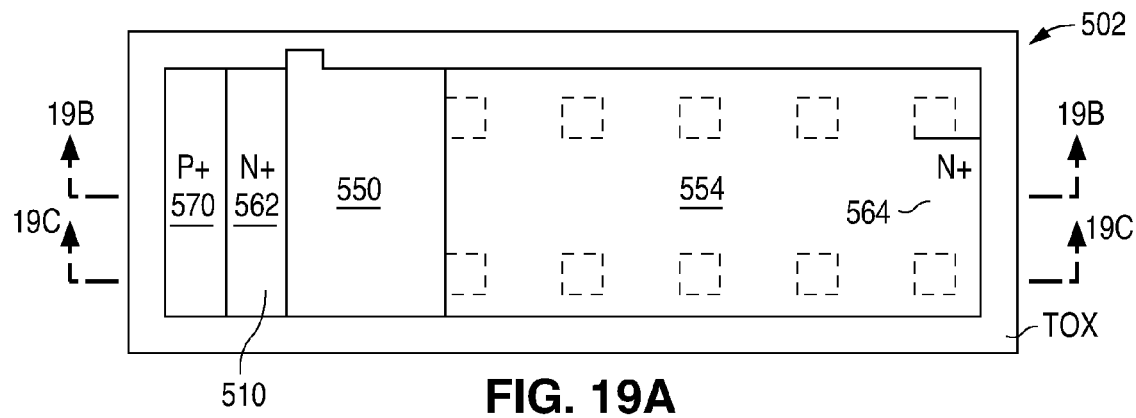
Figure 19B:
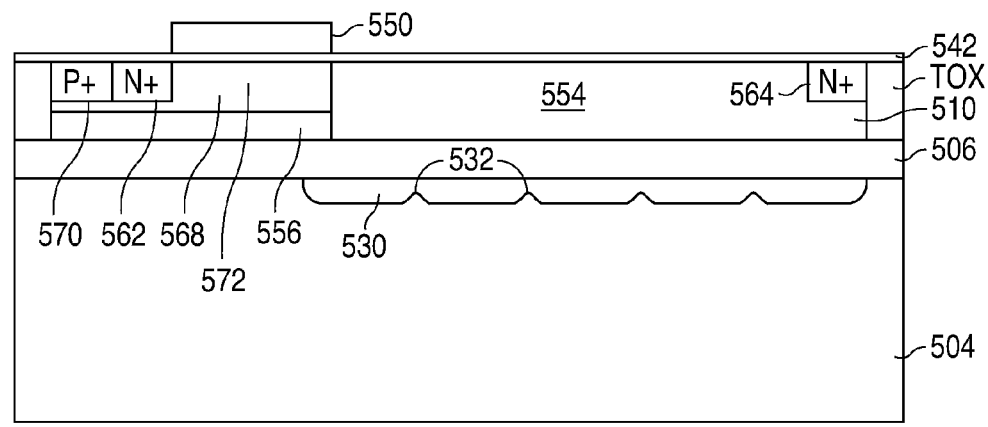
Figure 19C:
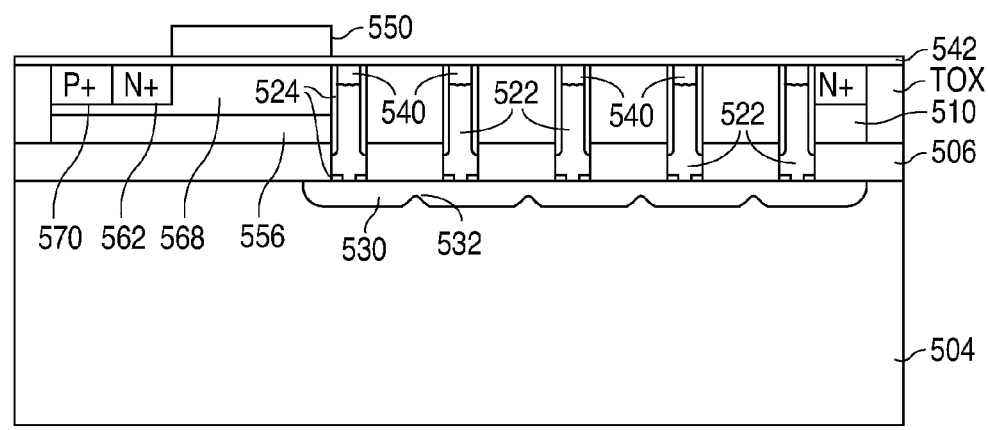

Following this, as shown in FIGS. 19A-19C, patterned photoresist layer 569 is removed in a conventional manner. A conventional rapid thermal process is used to drive in and activate the implants. (The implants can alternately be driven in and activated multiple times, such as after each implant.) Once the implants have been driven in and activated, the method continues with conventional back end processing steps to complete the formation of the DMOS transistor.

Thus, a method of forming a lateral DMOS transistor with a cavity 530 in a SOI wafer 502 has been disclosed. The method forms the cavity 530 by selectively etching a number of openings through the single-crystal semiconductor region 510 and the insulator layer 506 to expose a corresponding number of regions on bulk region 504 of the SOI wafer 502.

The method also forms a number of side wall spacers to touch the side walls of the number of openings 522, and wet etches bulk region 504 through the number of openings 522 to form a single cavity 530 that lies below each of the openings 522. Once the cavity 530 has been formed, the method also forms a number of plugs 540 that plug the openings 522.

FIG. 20 shows a cross-sectional diagram that illustrates an example of a DMOS transistor 2000 in accordance with the present invention. DMOS transistor 2000 is similar to DMOS transistor 300 and, as a result, utilizes the same reference numerals to designate the structures which are common to both transistors.

As shown in FIG. 20, DMOS transistor 2000 differs from DMOS transistor 300 in that DMOS transistor 2000 utilizes an n− drift region 2010 in lieu of n− drift region 114. N− drift region 2010, in turn, is thinner than n− drift region 114, thereby allowing a portion of p-type well region 110 to lie below n− drift region 2010.

In addition, cavity 310 is also shorter such that the edge of cavity 310 that lies closest to gate 132 is horizontally spaced apart from a vertical line that lies coincident with the edge of gate 132 that lies closest to cavity 310 by a horizontal separation distance $X_{SON}$. In this case, cavity 310 lies directly vertically below less than all of drift region 2010.

DMOS transistor 2000 operates the same as DMOS transistor 300, except that the depletion region across the junction between n− drift region 2010 and the portion of p-type well region 110 that lies below n− drift region 2010 substantially covers n− drift region 114, along with a portion of p-type well region 110 that lies below n− drift region 114.

DMOS transistor 2000 can be formed by implanting single-crystal semiconductor region 510 with a p-type dopant to have a dopant concentration of approximately $2.5 \times 10^{15}$ atoms/cm$^3$, and then growing an n-type epitaxial layer on the top surface of single-crystal semiconductor region 510 before the trench isolation region TOX is formed.

In addition, fewer openings 522 are formed to shorten the length of cavity 530 when bulk region 504 is wet etched. Also, when n− drift region 2010 is subsequently formed, n− drift region 2010 is formed with a lower implant energy to have a dopant concentration of approximately $3.0 \times 10^{15}$ atoms/cm$^3$.

FIGS. 21A and 21B show graphs that further illustrates the operation of DMOS transistor 2000 in accordance with the present invention. The graph in FIG. 21A compares the simulated breakdown voltage BVdss versus the depth D of cavity 310 of DMOS transistor 2000. As shown in FIG. 21A, with the correct depth D of cavity 310, a breakdown voltage BVdss of approximately 600V can be realized.

The graph in FIG. 21B compares the simulated breakdown voltage BVdss versus the horizontal separation distance $X_{SON}$ (measured between the edge of gate 132 and the edge of cavity 310. As shown in FIG. 21B, the highest breakdown voltage can be realized when a small horizontal separation exists between the edge of gate 132 and the edge of cavity 310.

In the FIG. 20 example, a DMOS transistor with a breakdown voltage BVdss of approximately 600V can be realized (with an insulator layer 106 approximately 1.0 μm thick, an n− drift region 2010 approximately 2.25 μm thick, and a p-type well region 110 directly below n− drift region 2010 approximately 2.2 μm thick when cavity 310 has a depth D of approximately 14 μm. Thus, although DMOS transistor 2000 has a slightly lower breakdown voltage BVdss than DMOS transistor 300, the depth D of cavity 310 in DMOS transistor 2000 is substantially larger.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A method of forming a DMOS transistor comprising:
providing a silicon-on-insulator (SOI) structure which includes a bulk region having a top surface; an insulator layer that touches the top surface of the bulk region, the insulator layer having a top surface and a bottom surface; and a single-crystal semiconductor region which includes:
forming a doped body region, of a first conductivity type that touches the insulator layer, and a drift region of a second conductivity type that touches the insulator layer;
forming a trench isolation structure that extends through the single-crystal region to touch the insulator layer forming a plurality of isolated regions of single-crystal semiconductor region;
depositing a layer of pad oxide onto the single-crystal semiconductor region, followed by depositing a silicon nitride layer onto the pad oxide layer;
forming a patterned photoresist layer on the top surface of the silicon nitride layer to form exposed regions on the silicon nitride layer;
forming a hard mask by using the patterned photoresist layer as a mask to etch the exposed regions on the silicon nitride layer and the pad oxide layer to result in the formation of exposed regions on the surface of the single-crystal semiconductor region;
using the hard mask, selectively etching the exposed regions on the surface of the single-crystal semiconductor region to form a plurality of openings through the single-crystal semiconductor region and the insulator layer, and thereby exposing a corresponding plurality of regions on the top surface of the bulk region of the silicon-on-insulator (SOI) structure, the plurality of openings having a plurality of side walls;
forming a plurality of side wall spacers that touch the plurality of side walls of the plurality of openings;
wet etching the bulk region through the plurality of openings to form a single cavity that lies below each of the plurality of openings;
wherein the single cavity exposes a portion of the bottom surface of the insulator layer, the portion of the bottom surface of the insulator layer lying directly vertically below the drift region;
forming a capping oxide layer that covers, but does not fill the plurality of openings; and
planarizing the top surface of the silicon-on-insulator (SOI) structure to remove the pad oxide layer and portions of the capping oxide layer until the top surface of the single-crystal semiconductor region is exposed.

2. The method of claim 1 and further comprising forming a plurality of non-conductive plugs that plug the plurality of openings.

3. The method of claim 1 and further comprising forming the doped body region of a first conductivity type and the drift region of a second conductivity type, the doped region touching the insulator layer, the drift region touching the doped body region.

4. The method of claim 3 wherein the cavity lies directly below all of the drift region.

5. The method of claim 3 wherein the cavity lies directly below less than all of the drift region.

6. The method of claim 3 and further comprising forming source and drain regions of the second conductivity type, the source region touching the doped body region and being spaced apart from the drift region, the drain region touching the drift region and being spaced apart from the doped body region.

* * * * *